United States Patent
Inoue et al.

(10) Patent No.: US 10,879,873 B2
(45) Date of Patent: Dec. 29, 2020

(54) RESONATOR AND RESONANCE DEVICE

(71) Applicant: Murata Manufacturing Co., Ltd., Nagaokakyo (JP)

(72) Inventors: Yoshihisa Inoue, Nagaokakyo (JP); Ryota Kawai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/804,252

(22) Filed: Feb. 28, 2020

(65) Prior Publication Data

US 2020/0204155 A1 Jun. 25, 2020

Related U.S. Application Data

(63) Continuation of application No. PCT/JP2018/016719, filed on Apr. 25, 2018.

(30) Foreign Application Priority Data

Sep. 28, 2017 (JP) ................... 2017-188215

(51) Int. Cl.
*H03H 9/24* (2006.01)
*H03H 3/007* (2006.01)
(Continued)

(52) U.S. Cl.
CPC ............ *H03H 9/24* (2013.01); *H03H 3/0077* (2013.01); *H03H 9/0595* (2013.01); *H03H 9/10* (2013.01);
(Continued)

(58) Field of Classification Search
CPC combination set(s) only.
See application file for complete search history.

(56) References Cited

U.S. PATENT DOCUMENTS

2014/0368088 A1* 12/2014 Takahashi .......... G01C 19/5607
310/348
2018/0226937 A1 8/2018 Umeda et al.
2019/0097600 A1* 3/2019 Yoshii ................ H03H 3/0077

FOREIGN PATENT DOCUMENTS

JP 2012065293 A 3/2012
JP 2014107817 A 6/2014
(Continued)

OTHER PUBLICATIONS

International Search Report Issued for PCT/JP2018/016719, dated Jul. 3, 2018.

(Continued)

*Primary Examiner* — Jeffrey M Shin
(74) *Attorney, Agent, or Firm* — Arent Fox LLP

(57) ABSTRACT

A resonator includes a vibration portion with upper and lower electrodes with a piezoelectric film disposed therebetween. Moreover, a protective film is provided to face the piezoelectric film with the upper electrode interposed therebetween and is exposed in a first region in the vibration portion. A conductive film is provided to face the piezoelectric film with the protective film interposed therebetween and is exposed in a second region that is adjacent to the first region in the vibration portion. A connection electrode is formed in the protective film to electrically connect the conductive film to the lower electrode. The upper electrode is formed such that an area of a region overlapping the conductive film is equal to or smaller than half of a total area of the conductive film and/or avoids the region overlapping the conductive film.

20 Claims, 13 Drawing Sheets

(51) Int. Cl.
*H03H 9/05* (2006.01)
*H03H 9/10* (2006.01)
*H03H 9/17* (2006.01)
*H03H 3/04* (2006.01)

(52) U.S. Cl.
CPC ....... *H03H 9/17* (2013.01); *H03H 2003/0435* (2013.01)

(56) References Cited

FOREIGN PATENT DOCUMENTS

| | | |
|---|---|---|
| WO | 2016159022 A1 | 10/2016 |
| WO | 2017090380 A1 | 6/2017 |
| WO | 2017208568 A1 | 12/2017 |

OTHER PUBLICATIONS

Written Opinion of the International Searching Authority issued for PCT/JP2018/016719, dated Jul. 3, 2018.

* cited by examiner

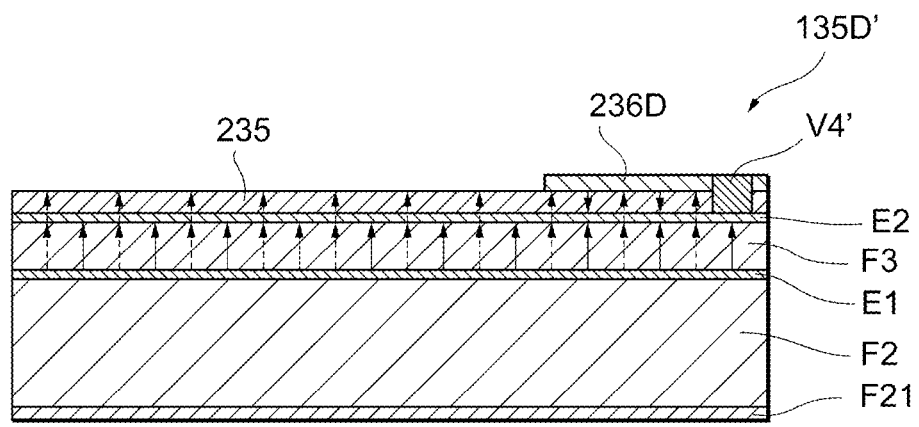
FIG. 6(A)
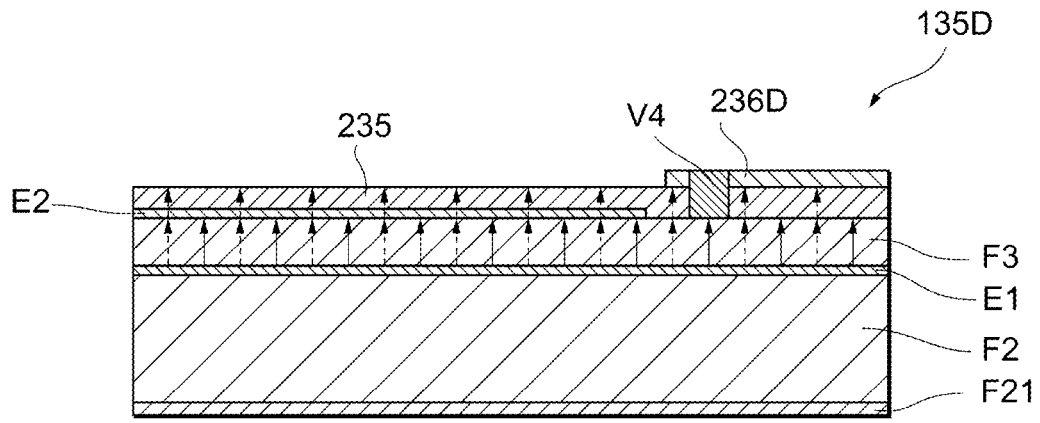
FIG. 6(B)
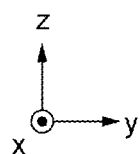

RESONATOR AND RESONANCE DEVICE

CROSS REFERENCE TO RELATED APPLICATIONS

The present application is a continuation of PCT/JP2018/016719 filed Apr. 25, 2018, which claims priority to Japanese Patent Application No. 2017-188215, filed Sep. 28, 2017, the entire contents of each of which are incorporated herein by reference.

TECHNICAL FIELD

The present invention relates to a resonator and a resonance device.

BACKGROUND

In general, resonators, such as a piezoelectric vibrator, are used as devices for implementing a clocking function in an electronic device. With miniaturization of electronic devices, resonators are also required to be miniaturized, and resonators manufactured by Micro Electro Mechanical Systems (MEMS) technology (hereinafter also referred to as "MEMS vibrators") have attracted attention.

In MEMS vibrators, there may be variations in resonant frequency due to manufacturing variations. Therefore, frequencies are adjusted by additional etching or the like during or after manufacturing of MEMS vibrators.

For example, Patent Document 1 (identified below) discloses a configuration in which a vibrator having a plurality of vibration arms adjusts a resonant frequency by reducing a mass portion for coarse adjustment provided on a distal end side of a vibration arm and a mass portion for fine adjustment provided on a base end side of the vibration arm.

Patent Document 1: Japanese Unexamined Patent Application Publication No. 2012-065293.

The mass portion described in Patent Document 1 includes an insulator layer and a conductive layer formed on the insulator layer. In the MEMS vibrator, when such a mass portion is formed and the resonant frequency is adjusted by using an ion beam, a pyroelectric material, or the like, the insulator layer may be charged in some cases. When the MEMS vibrator vibrates in a state in which the insulator layer on the MEMS vibrator is charged, Coulomb force is generated due to electric charges in the insulator layer, thereby influencing vibration of the resonator. As a result, there can be variations in the resonant frequency of the device.

SUMMARY OF THE INVENTION

Accordingly, the exemplary embodiments of the present invention have been made in view of such circumstances. Thus, it is an object of the present invention is to suppress influence of a voltage applied to an insulator layer on a resonator or a conductive layer on an insulator layer on vibration of the resonator.

In an exemplary embodiment, a resonator is provided that includes a vibration portion including an upper electrode and a lower electrode, a piezoelectric film provided between the upper electrode and the lower electrode, having a main surface facing the upper electrode, and that is configured to vibrate the vibration portion in a predetermined vibration mode when a voltage is applied between the upper electrode and the lower electrode. Moreover, a protective film is provided to face the main surface of the piezoelectric film with the upper electrode interposed between the protective film and the main surface of the piezoelectric film. The protective film is exposed in a first region in the vibration portion, and is made of an insulator. Furthermore, a conductive film is provided so as to face the main surface of the piezoelectric film with the protective film interposed between the conductive film and the main surface of the piezoelectric film and is exposed in a second region that is a region adjacent to the first region in the vibration portion. A connection electrode is disposed in the protective film to electrically connect the conductive film to the lower electrode, a frame is provided so as to surround at least a part of the vibration portion, and a holding arm connects the vibration portion and the frame. The upper electrode is formed such that an area of a region overlapping the conductive film is equal to or smaller than half of a total area of the conductive film or so as to avoid the region overlapping the conductive film.

According to the exemplary embodiments of the present invention, the influence of the voltage on the vibration of the resonator can be suppressed when the voltage is applied to the insulator layer on the resonator or the conductive layer on the insulator layer.

BRIEF DESCRIPTION OF DRAWINGS

FIG. 6(A) is a diagram schematically showing an alignment direction and an electric field direction for the resonator according to the first exemplary embodiment and FIG. 6(B) is a resonator of a comparative example.

DETAILED DESCRIPTION OF EMBODIMENTS

First Exemplary Embodiment

Figure 1:
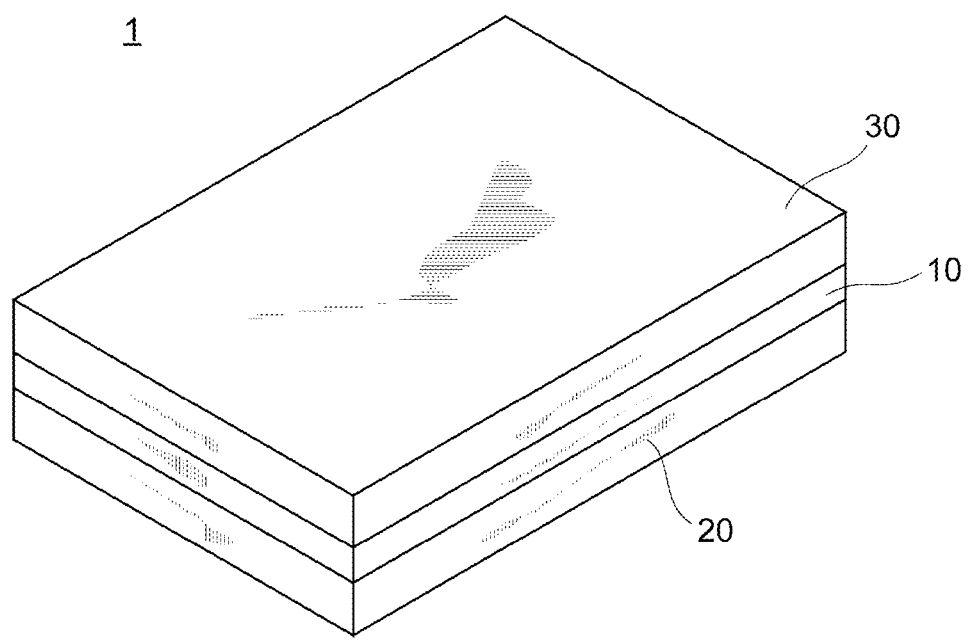
FIG. 1 is a perspective view schematically showing an appearance of a resonance device according to a first exemplary embodiment.
Figure 2:
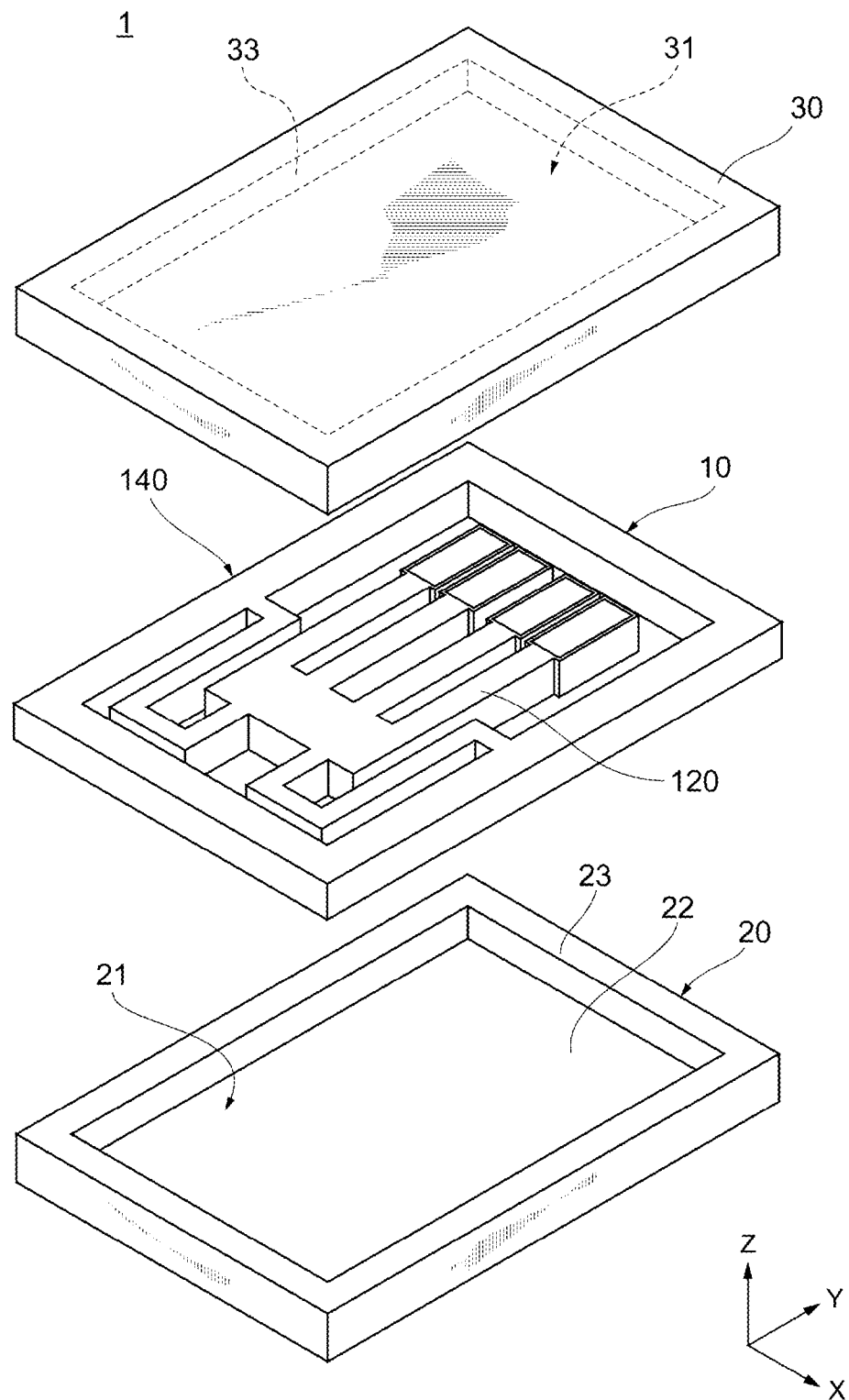
FIG. 2 is an exploded perspective view schematically showing a structure of the resonance device according to the first exemplary embodiment.

Hereinafter, the first exemplary embodiment of the present invention will be described with reference to the accompanying drawings. FIG. 1 is a perspective view schematically showing an appearance of a resonance device 1 according to the first exemplary embodiment. FIG. 2 is an exploded perspective view schematically showing a structure of the resonance device 1 according to the first exemplary embodiment.

As shown, the resonance device 1 includes a resonator 10, and an upper lid 30 and a lower lid 20 which are provided so as to face each other with the resonator 10 interposed therebetween. That is, the resonance device 1 is configured by laminating the lower lid 20, the resonator 10, and the upper lid 30 in this order according to an exemplary aspect.

Further, the resonator 10, and the lower lid 20 and the upper lid 30 are bonded to each other, respectively, whereby the resonator 10 is sealed therein, and a vibration space of the resonator 10 is formed. Each of the resonator 10, the lower lid 20, and the upper lid 30 is formed by using a Si substrate, for example. Moreover, the resonator 10, the lower lid 20 and the upper lid 30 are bonded to each other by bonding the Si substrates to each other. The resonator 10 and the lower lid 20 may be formed by using an SOI substrate.

The resonator 10 is a MEMS resonator manufactured by using MEMS technology. Additionally, in this embodiment, a case in which the resonator 10 is formed by using a silicon substrate will be described as an example. Hereinafter, each component of the resonance device 1 will be described in detail.

Upper Lid 30

The upper lid 30 spreads in a flat plate shape along an XY plane, and a concave portion 31 having, for example, a flat rectangular parallelepiped shape is formed on a rear surface of the upper lid 30. The concave portion 31 is surrounded by a side wall 33, and forms a part of the vibration space which is a space in which the resonator 10 vibrates.

Lower Lid 20

Similarly, the lower lid 20 includes a bottom plate 22 having a rectangular flat plate shape and provided along the XY plane, and a side wall 23 extending from a peripheral edge portion of the bottom plate 22 in a Z-axis direction (that is, in a laminating direction of the lower lid 20 and the resonator 10). A concave portion 21 formed by a surface of the bottom plate 22 and an inner surface of the side wall 23 is provided on a surface facing the resonator 10 of the lower lid 20. The concave portion 21 forms a part of the vibration space of the resonator 10. By the upper lid 30 and the lower lid 20, the vibration space is hermetically sealed, and is maintained in a vacuum state. Moreover, the vibration space may be filled with gas such as inert gas, for example.

Resonator 10

Figure 3:
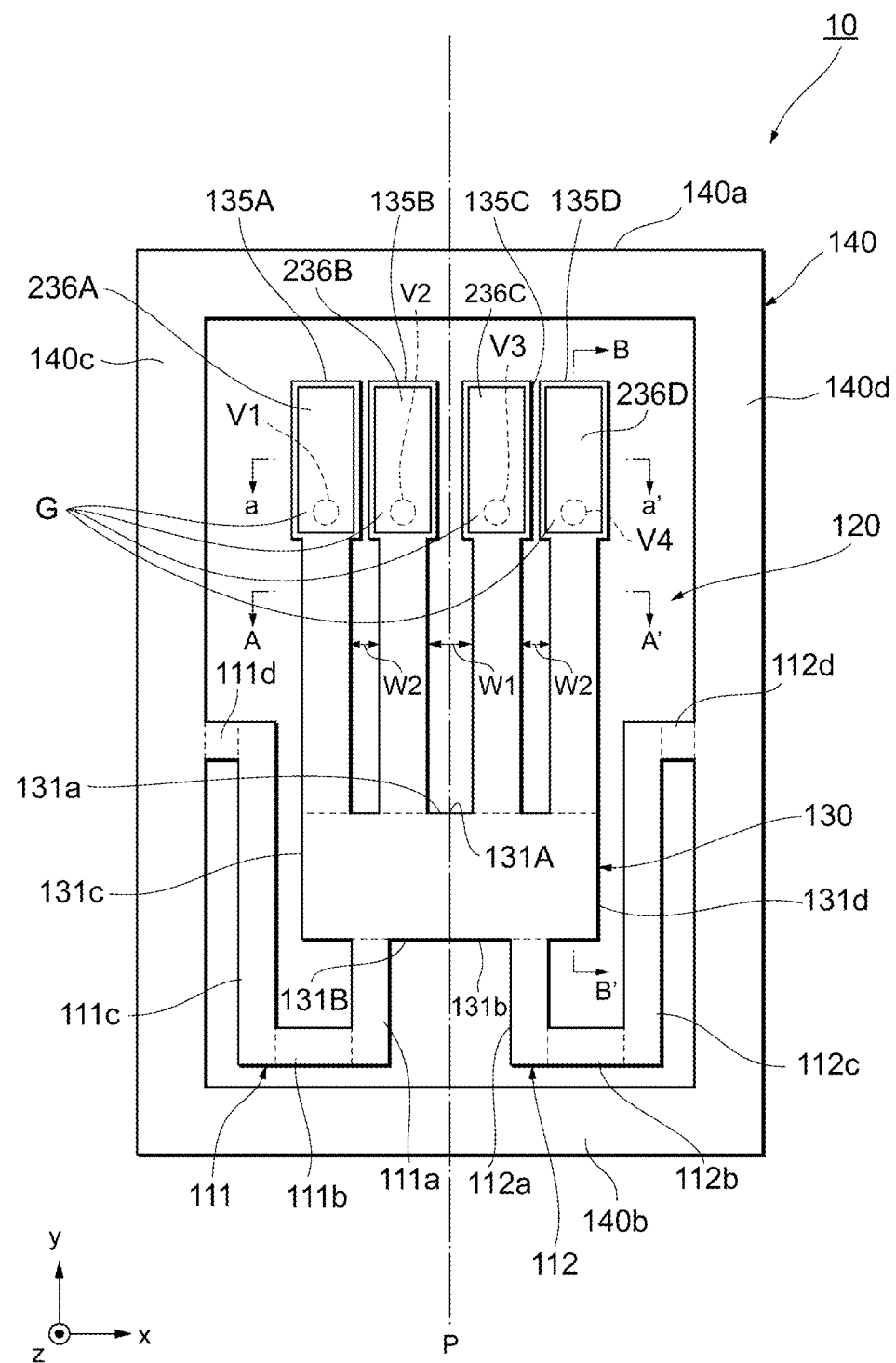
FIG. 3 is a plan view of a resonator according to the first exemplary embodiment, in which an upper substrate is removed.

FIG. 3 is a plan view schematically showing a structure of the resonator 10 according to the present embodiment. Each component of the resonator 10 according to the present embodiment will be described with reference to FIG. 3. The resonator 10 includes a vibration portion 120, a holding portion 140 (or frame), holding arms 111 and 112, and vias V1, V2, V3, and V4.

Vibration Portion 120

The vibration portion 120 has a rectangular contour extending along an XY plane in an orthogonal coordinate system shown in FIG. 3. The vibration portion 120 is provided inside the holding portion 140, and a space is formed between the vibration portion 120 and the holding portion 140 at a predetermined interval. In the example shown in FIG. 3, the vibration portion 120 includes a base 130 and four vibration arms 135A to 135D (collectively referred to as "vibration arms 135"). It is noted that the number of the vibration arms is not limited to four, but may be set to any number of one or more. In the present embodiment, the respective vibration arms 135 and the base portion 130 are formed integrally.

The base 130 has long sides 131a and 131b extending in an X-axis direction, and short sides 131c and 131d extending in a Y-axis direction in a plan view. The long side 131a is one side of a front end surface 131A (hereinafter also referred to as "front end 131A") of the base 130, and the long side 131b is one side of a rear end surface 131B (hereinafter also referred to as "rear end 131B") of the base 130. In the base 130, the front end 131A and the rear end 131B are provided so as to face each other.

The base 130 is connected to the vibration arms 135 (which will be described later) at the front end 131A, and is connected to the holding arms 111 and 112 (which will be described later) at the rear end 131B. It is noted that, in the example shown in FIG. 3, the base 130 has a substantially rectangular shape in a plan view, but is not limited thereto, and may be formed so as to be substantially symmetric with respect to a virtual plane P defined along a perpendicular bisector of the long side 131a. For example, the base 130 may have a trapezoidal shape in which the long side 131b is shorter than the long side 131a, or a semicircular shape in which the long side 131a is defined as a diameter. Further, the long sides 131a and 131b and the short sides 131c and 131d are not limited to straight lines, and may be curved lines in alternative aspects.

In the base 130, a base length which is the maximum distance between the front end 131A and the rear end 131B in a direction from the front end 131A to the rear end 131B (i.e., a length of the short sides 131c and 131d in FIG. 3) is about 40 μm, for example. In addition, a base width which is the longest distance between the side ends of the base portion 130 in a width direction orthogonal to the base portion length direction (i.e., a length of the long sides 131a and 131b in FIG. 3) is about 285 μm, for example.

The vibration arms 135 extend in a Y-axis direction and have the same size. Each of the vibration arms 135 is provided between the base 130 and the holding portion 140 in parallel to the Y-axis direction, and one end thereof is connected to the front end 131A of the base 130 to form a fixed end, and the other end thereof forms an open end. Further, the vibration arms 135 are provided in parallel with each other at a predetermined interval in the X-axis direction. The vibration arm 135 has a width in the X-axis direction of about 50 μm and a length in the Y-axis direction of about 420 μm, for example.

Each of the vibration arms 135 has a weight portion G at the open end thereof. The weight portion G is wider in the X-axis direction than the other portions of the vibration arm 135. The weight portion G has a width in the X-axis direction of about 70 μm, for example. The weight portion G is integrally formed by the same process as a formation process of the vibration arm 135. By forming the weight portion G, the weight per unit length of the vibration arm 135 is heavier at an open end side than at a fixed end side. Therefore, since each of the vibration arms 135 has the weight portion G at the open end side, an amplitude of vibration in a vertical direction (i.e., the Z axis direction) in each of the vibration arms can be increased.

In the vibration portion 120 of the present embodiment, two vibration arms 135A and 135D are disposed at an outer side portion in the X-axis direction, and two vibration arms 135B and 135C are disposed at an inner side portion. An interval W1 between the vibration arms 135B and 135C in the X-axis direction is set to be larger than an interval W2 between the vibration arm 135A (135D) disposed at the outer side portion and the vibration arm 135B (135C)

disposed at the inner side portion and being adjacent to the vibration arm 135A (135D) disposed at the outer side portion in the X-axis direction. The interval W1 is, for example, about 35 μm, and the interval W2 is, for example, about 25 μm. By setting the interval W2 to be smaller than the interval W1, vibration characteristics are improved. Further, in order to miniaturize the resonance device 1, the interval W1 may be set to be smaller than the interval W2, or may be set to be equal to the interval W2.

A protective film 235 is formed on a surface of the vibration portion 120 (i.e., a surface facing the upper lid 30) so as to cover the entire surface of the vibration portion 120. Further, frequency adjustment films 236A to 236D are formed on parts of a surface of the protective film 235 on the vibration arms 135A to 135D, respectively. According to the present disclosure, the frequency adjustment films 236A to 236D are an example of a conductive film and are also collectively referred to as "frequency adjustment films 236". A resonant frequency of the vibration portion 120 can be adjusted by the protective film 235 and the frequency adjustment films 236. It is noted that the protective film 235 does not necessarily cover the entire surface of the vibration portion 120, but it is preferable that the protective film 235 covers the entire surface of the vibration portion 120 in order to protect an underlying electrode film (for example, a metal layer E2 in FIG. 4) and a piezoelectric film (for example, a piezoelectric thin film F3 in FIG. 4) from damage during the frequency adjustment.

The frequency adjustment film 236 is formed on the protective film 235 such that the surface thereof is exposed in at least a part of a region having a larger average displacement due to vibration than other regions in the vibration portion 120. Specifically, the frequency adjustment film 236 is formed at the distal end of the vibration arm 135, that is, in the weight portion G (one example of the second region). On the other hand, the surface of the protective film 235 is exposed in the other region (one example of the first region) of the vibration arm 135. In this embodiment, the frequency adjustment film 236 is formed to the distal end of the vibration arm 135, and the protective film 235 is not exposed at the distal end portion at all, but it is also possible to adopt a configuration in which the frequency adjustment film 236 is not formed at the distal end portion of the vibration arm 135 such that a part of the protective film 235 is exposed. It is noted that a second frequency adjustment film may be formed on a base side (e.g., a side connected to the base 230) of the vibration arm 135. In this case, it is possible to suppress a change in temperature characteristics of the frequency due to the frequency adjustment.

(b) Holding Portion 140

The holding portion 140 (also referred to as a frame) is formed in a rectangular frame shape along the XY plane. The holding portion 140 is provided so as to surround an outer side portion of the vibration portion 120 along the XY plane in a plan view. It is noted that the holding portion 140 may be provided in at least a part of a periphery of the vibration portion 120, and is not limited to the frame shape. For example, the holding portion 140 may be provided around the vibration portion 120 so as to be able to hold the vibration portion 120 and to be able to bond the upper lid 30 and the lower lid 20.

In this embodiment, the holding portion 140 is formed of frame bodies 140a to 140d each of which has a rectangular column shape and which are integrally formed. As shown in FIG. 3, the frame body 140a is provided so as to face open ends of the vibration arms 135, and a longitudinal direction thereof is parallel to the X-axis direction. The frame body 140b is provided so as to face the rear end 131B of the base 130, and the longitudinal direction thereof is parallel to the X-axis. The frame body 140c is provided so as to face a side end (i.e., the short side 131c) of the base 130 and the vibration arm 135A, the longitudinal direction thereof is parallel to the Y-axis, and respective ends thereof are individually connected to one end of the frame body 140a and one end of the frame body 140b. The frame body 140d is provided so as to face a side end (i.e., the short side 131d) of the base 130 and the vibration arm 135D, the longitudinal direction thereof is parallel to the Y-axis, and respective ends thereof are individually connected to the other end of the frame body 140a and the other end of the frame body 140b.

In the present embodiment, a case is described where the holding portion 140 is covered with the protective film 235, but it is noted that the present invention is not limited thereto, and the protective film 235 may not be formed on the surface of the holding portion 140.

(c) Holding Arms 111 and 112

The holding arm 111 and the holding arm 112 are provided in an inner side portion of the holding portion 140, and connect the rear end 131B of the base 130 to the frame bodies 140c and 140d. As shown in FIG. 3, the holding arm 111 and the holding arm 112 are formed substantially symmetrically with respect to a virtual plane P defined in parallel to the YZ plane along a center line in the X-axis direction of the base 130.

As shown, the holding arm 111 includes arms 111a, 111b, 111c, and 111d. The holding arm 111 has one end connected to the rear end 131B of the base 130, and extends from the connected one end toward the frame body 140b. The holding arm 111 is bent in a direction toward the frame body 140c (that is, in the X-axis direction), is further bent in a direction toward the frame body 140a (that is, in the Y— axis direction), is bent in the direction toward the frame body 140c (that is, in the X-axis direction) again, and is connected to the frame body 140c at the other end thereof.

The arm 111a is provided between the base portion 130 and the frame body 140b so as to face the frame body 140c and to be parallel to the Y-axis in a longitudinal direction thereof. The arm 111a has one end connected to the base portion 130 at the rear end 131B, and extends from the connected one end substantially perpendicularly to the rear end 131B, that is, in the Y-axis direction. An axis passing through a center of the arm 111a in the X-axis direction is preferably provided in an inner side portion of a center line of the vibration arm 135A, and in the example shown in FIG. 3, the arm 111a is provided between the vibration arms 135A and 135B. Additionally, the other end of the arm 111a is connected to one end of the arm 111b on a side surface thereof. The arm 111a has a width defined in the X-axis direction of about 20 μm, and a length defined in the Y-axis direction of 40 μm, for example.

The arm 111b is provided between the base 130 and the frame body 140b so as to face the frame body 140b and to be parallel to the X-axis direction in a longitudinal direction thereof. The arm 111b has one end connected to the side surface of the arm 111a that is the other end of the arm 111a and that is at a side facing the frame body 140c, and extends from the connected one end substantially perpendicularly to the arm 111a, that is, in the X-axis direction. Further, the other end of the arm 111b is connected to a side surface of the arm 111c that is one end of the arm 111c and that is at a side facing the vibration portion 120. The arm 111b has a width defined in the Y-axis direction of about 20 μm, and a length defined in the X-axis direction of about 75 μm, for example.

The arm 111c is provided between the base 130 and the frame body 140c so as to face the frame body 140c, and to be parallel to the Y-axis direction in a longitudinal direction thereof. One end of the arm 111c is connected to the other end of the arm 111b on a side surface thereof, and the other end of the arm 111c is connected to a side surface that is one end of the arm 111d and that is at a side of the frame body 140c. The arm 111c has a width defined in the X-axis direction of about 20 µm, and a length defined in the Y-axis direction about 140 µm, for example.

The arm 111d is provided between the base 130 and the frame body 140c so as to face the frame body 140a and to be parallel to the X-axis direction in a longitudinal direction thereof. One end of the arm 111d is connected to a side surface of the arm 111c that is the other end of the arm 111c and that is at a side facing the frame body 140c. Additionally, the arm 111d is connected to the frame body 140c at a position where the other end thereof faces a vicinity of a connection portion between the vibration arm 135A and the base 130, and extends from the position substantially perpendicular to the frame body 140c, that is, in the X-axis direction. The arm 111d has a width defined in the Y-axis direction of about 20 µm and a length defined in the X-axis direction of about 10 µm, for example.

In this manner, the holding arm 111 is connected to the base 130 at the arm 111a, is bent at a connection portion of the arm 111a and the arm 111b, a connection portion of the arm 111b and the arm 111c, and a connection portion of the arm 111c and the arm 111d, and thereafter, is connected to the holding portion 140.

As shown, the holding arm 112 has a similar configuration as holding arm 111. Specifically, the holding arm 112 includes arms 112a, 112b, 112c, and 112d. The holding arm 112 has one end connected to the rear end 131B of the base 130, and extends from the connected one end toward the frame body 140b. Moreover, the holding arm 112 is bent in a direction toward the frame body 140d (that is, in the X-axis direction), is further bent in a direction toward the frame body 140a (that is, in the Y-axis direction), is bent in a direction toward the frame 140d (that is, in the X-axis direction) again, and is connected to the frame body 140d at the other end thereof.

It is otherwise noted that since configurations of the arms 112a, 112b, 112c and 112d are symmetrical with respect to those of the arms 111a, 111b, 111c and 111d, respectively, detailed description thereof will be omitted.

(d) Vias V1, V2, V3, and V4

Figure 4:
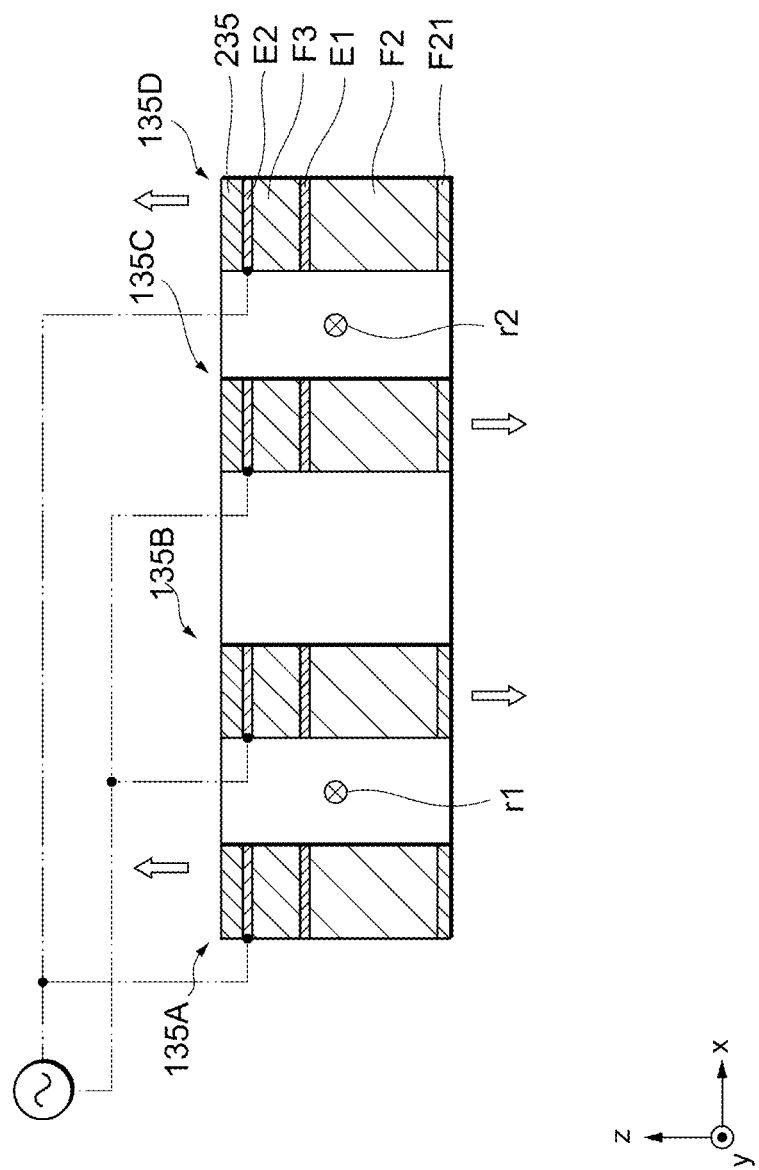
FIG. 4 is a cross-sectional view taken along a line AA' or a line aa' in FIG. 3.

The vias V1, V2, V3, and V4 are holes filled with metal and formed on vicinities of the distal end portions of the vibration arms 135, and electrically connect the frequency adjustment films 236A, 236B, 236C, and 236D and a metal layer E1 (see FIG. 4) described later. In FIG. 4, two-dot chain lines indicate electrical connection, and in FIG. 3, dotted lines indicate electrical connection by the vias V1, V2, V3, and V4 in particular.

As will be described in detail later, the vias V1, V2, V3, and V4 are formed in vicinities of boundaries between regions where the frequency adjustment films 236 are exposed and regions where the protective film 235 is exposed, at the distal end portions of the vibration arms 135A, 135B, 135C and 135D, respectively. In this embodiment, each of the vias V1, V2, V3, and V4 is formed at an end portion at a fixed end side of the weight portion G. Note that each of positions where the vias V1 to V4 are formed is not limited to the position shown in FIG. 3, but may be formed in a region at an open end side of the weight portion G, for example.

Laminated Structure

Figure 5:
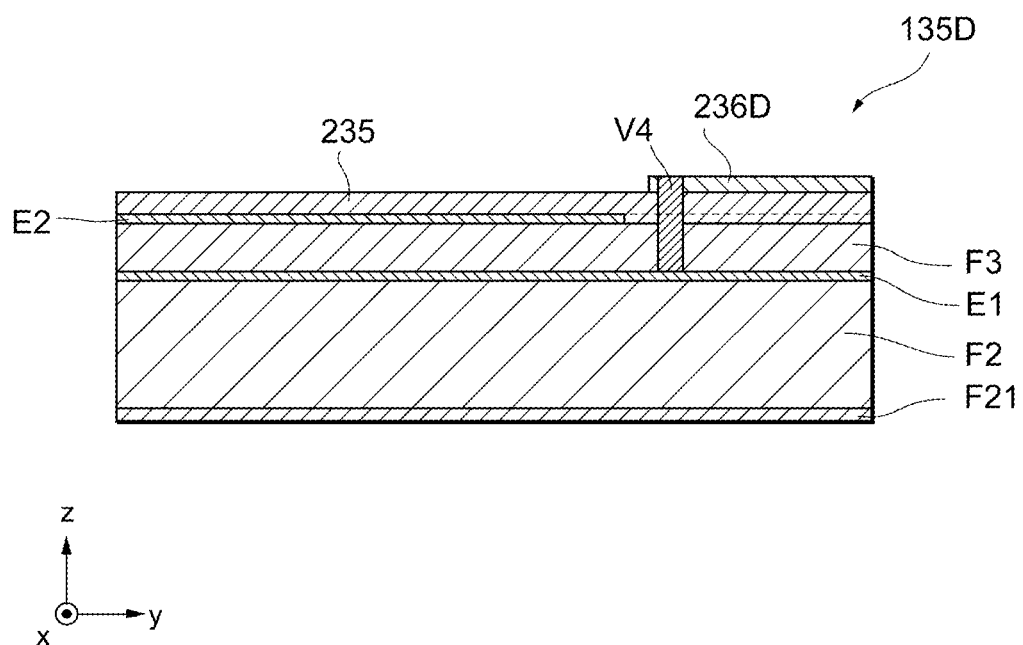
FIG. 5 is a cross-sectional view taken along a line BB' in FIG. 3.

A laminated structure of the resonator 10 will be described with reference to FIG. 4 and FIG. 5. FIG. 4 is a schematic diagram schematically showing a cross section taken along the line AA' in FIG. 3 and an electrical connection mode of the resonator 10, and FIG. 4 is a schematic diagram schematically showing a cross section taken along the line aa' in FIG. 3 and an electrical connection mode of the resonator 10. FIG. 5 is a schematic diagram schematically showing a cross section taken along the line BB' in FIG. 3, and shows a case where the frequency adjustment film 236D is connected to the metal layer E1.

In the resonator 10, the holding portion (or frame) 140, the base 130, the vibration arms 135, and the holding arms 111 and 112 are integrally formed by the same process according to an exemplary aspect. In the resonator 10, first, the metal layer E1 (one example of the lower electrode) is laminated on a Si (silicon) substrate F2. Additionally, the piezoelectric thin film F3 (one example of the piezoelectric film) is laminated on the metal layer E1 so as to cover the metal layer E1, and the metal layer E2 (one example of the upper electrode) is laminated on a surface (one example of the main surface) of the piezoelectric thin film F3. The protective film 235 is laminated on the metal layer E2 so as to cover the metal layer E2. On the vibration portion 120, the frequency adjustment film 236 is further laminated on the protective film 235. In order to suppress a change in characteristics due to short circuit between the metal layer E1 and the frequency adjustment film 236, it is desirable to pattern the metal layer E2 such that the metal layer E2 does not extend to the distal end of the vibration arm. In addition, it is also possible to omit the metal layer E1 by using a degenerate silicon substrate having low resistance, because the Si substrate F2 itself also serves as the metal layer E1.

The Si substrate F2 is formed of a degenerate n-type Si semiconductor having a thickness of about 6 µm, for example, and may include P (phosphorus), As (arsenic), Sb (antimony), or the like as an n-type dopant. In particular, a rotation angle between the vibration arm 135 and a [100] crystal axis of the Si substrate F2 configured with an n-type Si semiconductor or its equivalent crystal axis is preferably larger than 0 degree and smaller than or equal to 15 degrees (or larger than or equal to 0 degree and smaller than or equal to 15 degrees), or larger than or equal to 75 degrees and smaller than or equal to 90 degrees. Here, the rotation angle is an angle in a direction in which the holding arm 110 extends with respect to a line segment along the [100] crystal axis of the Si substrate F2 or its equivalent crystal axis according to the exemplary embodiment.

Further, a resistance value of the degenerate Si used for the Si substrate F2 is, for example, smaller than 1.6 mΩ·cm, and more preferably smaller than or equal to 1.2 mΩ·cm. Further, a silicon oxide (for example, $SiO_2$) layer (temperature characteristic correction layer) F21 is formed on a lower surface of the Si substrate F2. This configuration makes it possible to improve the temperature characteristics.

In the present embodiment, the silicon oxide layer (i.e., a temperature characteristic correction layer) F21 is a layer having a function of reducing a temperature coefficient of frequency (that is, a change rate per temperature) at least around room temperature in the vibration portion when a temperature correction layer is formed on the Si substrate F2, in comparison with a case where the silicon oxide layer F21 is not formed on the Si substrate F2. Since the vibration portion 120 has the silicon oxide layer F21, it is possible to reduce a change in resonant frequency of the laminated structure formed of, for example, the Si substrate F2, the metal layers E1 and E2, the piezoelectric thin film F3, and the silicon oxide layer (temperature correction layer) F21, due to temperature.

In the resonator 10, it is preferable that the silicon oxide layer F21 is formed to have a uniform thickness. It is noted that the uniform thickness means that variations in thickness of the silicon oxide layer F21 are within ±20% of an average value of the thicknesses.

Furthermore, the silicon oxide layer F21 may be formed on an upper surface of the Si substrate F2, or may be formed on both the upper surface and the lower surface of the Si substrate F2. In addition, in the holding portion 140, the silicon oxide layer F21 may not be formed on the lower surface of the Si substrate F2.

The metal layers E2 and E1 are formed using, for example, molybdenum (Mo), aluminum (Al), or the like having a thickness of about 0.1 to 0.2 μm, for example. The metal layers E2 and E1 are formed to have a desired shape by etching or the like. The metal layer E1 is formed so as to function as a lower electrode, a float electrode, or a ground electrode, for example, on the vibration portion 120. In this embodiment, the metal layer E1 functions as the float electrode. Additionally, the metal layer E1 is formed on the holding arms 111 and 112 and the holding portion 140 so as to function as wiring for connecting the lower electrode or the ground electrode to an AC power supply provided outside the resonator 10.

On the other hand, the metal layer E2 is formed so as to function as an upper electrode on the vibration portion 120. Moreover, the metal layer E2 is formed on the holding arms 111 and 112 and the holding portion 140 so as to function as wiring for connecting the upper electrode to a circuit provided outside the resonator 10.

For connection from the AC power supply or the ground electrode to lower wiring or upper wiring, a configuration where an electrode (e.g., an example of the outer electrode) is formed on an outer surface of the upper lid 30 and the electrode connects a circuit and the lower wiring or the upper wiring, or a configuration where a via is formed in the upper lid 30, a conductive material is filled inside the via to provide wiring, and the wiring connects the AC power supply and the lower wiring or the upper wiring, may be used.

The piezoelectric thin film F3 is a thin film of a piezoelectric material that converts an applied voltage into vibration, and for example, a nitride such as AlN (aluminum nitride) or an oxide can be used as a main component. Specifically, the piezoelectric thin film F3 can be formed of ScAlN (scandium aluminum nitride). ScAlN is a material in which a part of aluminum in aluminum nitride is replaced by scandium. In addition, the piezoelectric thin film F3 has a thickness of, for example, 1 μm, but it is also possible to use a piezoelectric thin film having a thickness of about 0.2 μm to about 2 μm.

The piezoelectric thin film F3 expands and contracts in an in-plane direction of the XY plane, that is, in the Y-axis direction, according to an electric field applied to the piezoelectric thin film F3 by the metal layers E2 and E1. Due to the expansion and contraction of the piezoelectric thin film F3, the vibration arm 135 displaces its open end toward inner surfaces of the lower lid 20 and the upper lid 30, and vibrates in an out-of-plane bending vibration mode. In this embodiment, two inner arms and two outer arms perform bending vibration in mutually opposite directions in the out-of-plane bending vibration mode for four arms. However, it is noted that the present invention is not limited thereto. For example, a configuration where there is only one vibration arm, or a configuration where the vibration arm vibrates in an in-plane bending vibration mode, may be used.

The protective film 235 is a layer of a piezoelectric insulator, and is formed of a material having a slower mass reduction rate by etching than that of the frequency adjustment film 236. For example, the protective film 235 is formed of a nitride film such as AlN or ScAlN, an oxide film such as $ZnO_2$, a PZ film, or the like. It is noted that the mass reduction rate is expressed by a product of an etching rate (i.e., a thickness removed per unit time) and a density. A thickness of the protective film 235 is equal to or less than half of a thickness (in a C-axis direction) of the piezoelectric thin film F3, and is, for example, about 0.2 μm in the present embodiment. Additionally, the more preferable thickness of the protective film 235 is about one fourth of the thickness of the piezoelectric thin film F3. In addition, it is preferable to use a piezoelectric protective film having substantially the same orientation as that of the piezoelectric thin film F3.

According to the exemplary embodiment, the frequency adjustment film 236 is a conductive layer, and is formed of a material having a faster mass reduction rate by etching than that of the protective film 235. The frequency adjustment film 236 is made of, for example, a metal such as molybdenum (Mo), tungsten (W), gold (Au), platinum (Pt), nickel (Ni), aluminum (Al), or titanium (Ti).

When a relationship between the mass reduction rates of the protective film 235 and the frequency adjustment film 236 is the same as that described above, a magnitude relationship between the etching rates is arbitrary.

The frequency adjustment film 236 is formed substantially over the entire surface of the vibration portion 120, and then is reduced to be disposed only in a predetermined region by etching or the like.

The protective film 235 and the frequency adjustment film 236 are etched by, for example, simultaneously irradiating the protective film 235 and the frequency adjustment film 236 with an ion beam (for example, an argon (Ar) ion beam). The ion beam can be irradiated over a wider area than the resonator 10. Moreover, although an example in which etching is performed by an ion beam is described in the present embodiment, the etching method is not limited to that using an ion beam.

As shown in FIG. 5, the frequency adjustment film 236D is connected to the metal layer E1 with the via V4 interposed therebetween. As shown in FIG. 5, when the frequency adjustment film 236D is connected to the metal layer E1, the via V4 is formed by filling a hole in which a part of the protective film 235 and the piezoelectric thin film F3 are removed so as to expose a surface of the metal layer E1, with a conductive material. The frequency adjustment film 236D is connected to the metal layer E1 with the via V4 interposed therebetween on the surface of the protective film 235.

Further, the metal layer E2 is formed by adjusting an area of a region of the metal layer E2 that overlaps the frequency adjustment film 236 as small as possible. For example, it is preferable that the metal layer E2 is formed such that the region overlapping the frequency adjustment film 236 is smaller than or equal to half of an area of the frequency adjustment film 236. For example, in a direction in which the vibration arm 135A extends, a length of the overlapping region between the metal layer E2 and the frequency adjustment film 236 may be shorter than or equal to half of a length of the metal layer E2. It is noted that, in this embodiment, the frequency adjustment film 236 is formed in the weight portion G, and the metal layer E2 is formed in a region other than the weight portion G in the vibration arm 135.

Next, an effect of reducing the overlapping region between the metal layer E2 and the frequency adjustment film 236 will be described with reference to FIGS. 6(A) and 6(B). FIG. 6(A) is a cross-sectional view of a resonator 10' of a comparative example in a case where the metal layer E2 and the frequency adjustment film 236D are formed so as to overlap each other. FIG. 6(B) is a cross-sectional view of the resonator 10 according to the present embodiment taken along the line BB' in a similar manner as in FIG. 5. In FIGS. 6(A) and 6(B), a dashed line indicates an orientation direction of the piezoelectric thin film F3 and the protective film 235 having piezoelectricity, and a solid line indicates an electric field direction.

In the resonator 10' of the comparative example shown in FIG. 6(A), in a case where the metal layer E1 and the frequency adjustment film 236D are connected to each other, when a voltage is applied to the metal layers E1 and E2, electric fields in reverse directions to each other are generated in the protective film 235 and the piezoelectric thin film F3. Then, the electric field generated in the protective film 235 inhibits the vibration of the piezoelectric thin film F3.

On the other hand, as shown in FIG. 6(B), in the resonator 10 according to the present embodiment, the metal layer E2 is formed by adjusting the area of the region where the metal layer E2 overlaps the frequency adjustment film 236 as small as possible. Therefore, inhibition of the vibration of the piezoelectric thin film F3 due to the electric field generated in the protective film 235 is otherwise reduced. In particular, in the example shown in FIG. 6(B), the metal layer E2 and the frequency adjustment film 236 are formed so as not to overlap each other. Therefore, since an electric field is not generated in the protective film 235, the vibration of the piezoelectric thin film F3 can be further prevented from being inhibited.

Specifically, when equivalent series capacitances of the resonator 10' of the comparative example and the resonator 10 according to the present embodiment were measured, it was found that the equivalent series capacitance of the resonator 10' of the comparative example was 4.92 [fF], whereas the equivalent series capacitance of the resonator 10 according to the present embodiment was 5.18 [fF], and performance of the resonator 10 according to the present embodiment was improved.

Function of Resonator

A function of the resonator 10 will be described with reference to FIG. 4. In this embodiment, a phase of an electric field applied to the vibration arms 135A and 135D disposed at the outer side portion and a phase of an electric field applied to the vibration arms 135B and 135C disposed at the inner side portion are set to be opposite to each other. Thus, the vibration arms 135A and 135D disposed at the outer side portion and the vibration arms 135B and 135C disposed at the inner side portion are displaced in opposite directions to each other. For example, when the open ends of the vibration arms 135A and 135D disposed at the outer side portion are displaced toward the inner surface of the upper lid 30, the open ends of the vibration arms 135B and 135C disposed at the inner side portion are displaced toward the inner surface of the lower lid 20.

Accordingly, in the resonator 10 according to the present embodiment, the vibration arm 135A and the vibration arm 135B vibrate in the reverse phases, that is, in vertically reverse directions around a central axis r1 that extends in parallel to the Y-axis between the vibration arm 135A and the vibration arm 135B shown in FIG. 4. Further, the vibration arm 135C and the vibration arm 135D vibrate in vertically reverse directions around a central axis r2 that extends in parallel to the Y-axis between the vibration arm 135C and the vibration arm 135D. As a result, torsional moments in reverse directions are generated at the central axes r1 and r2, and bending vibration is generated in the base portion 130.

Function of Frequency Adjustment Film

Next, a function of the frequency adjustment film 236 will be described. In the resonance device 1 according to the present embodiment, after the resonator 10 is formed as described above, a trimming process for adjusting the film thickness of the frequency adjustment film 236 is performed.

In the trimming process, the resonant frequency of the resonator 10 is first measured, and a deviation with respect to a target frequency is calculated. Next, the film thickness of the frequency adjustment film 236 is adjusted based on the calculated frequency deviation. The adjustment of the film thickness of the frequency adjustment film 236 can be performed by, for example, irradiating an argon (Ar) ion beam over the entire surface of the resonance device 1 to etch the frequency adjustment film 236. Further, when the film thickness of the frequency adjustment film 236 is adjusted, it is preferable to clean the resonator 10 and remove the scattered film.

By adjusting the film thickness of the frequency adjustment film 236 by the trimming process as described above, variations in frequency can be suppressed among a plurality of resonance devices 1 to be manufactured on the same wafer.

Connection Mode

A connection mode between the frequency adjustment film 236 and the metal layer E1 in the resonator 10 according to the present embodiment will be described with reference to FIG. 5 again as an example of a connection mode between the frequency adjustment film 236D and the metal layer E1.

As shown in FIG. 5, when the frequency adjustment film 236D is connected to the metal layer E1, the via V4 is formed by filling in a conductive material into a hole in which parts of the protective film 235, the metal layer E2, and the piezoelectric thin film F3 are removed such that the surface of the metal layer E1 is exposed. The frequency adjustment film 236D is connected to the metal layer E1 with the via V4 interposed therebetween.

An effect of the frequency adjustment film 236D being electrically connected to the metal layer E1 will be described. In the above-described trimming process, when the ion beam is irradiated to the resonator 10, the protective film 235 is also irradiated with the ion beam, so that the protective film 235 is charged by electric charges included in the ion beam. In addition, in the protective film 235 having piezoelectricity, since a pyroelectric effect is generated due to temperature rise and fall, the electric charges are deposited on an interface of the protective film 235.

In the exemplary resonator 10, the frequency adjustment film 236D that is made of a conductive material and that is formed on a part of the protective film 235 is connected to the metal layer E1 with the via V4 interposed therebetween. Thereby, the electric charges charged in the protective film 235 can be transferred to the metal layer E1. The electric charges transferred to the metal layer E1 can be released to an outside of the resonance device 1 via a connection terminal connected to the outside and connected to the metal layer E1. As described above, in the resonator 10, the electric charges are prevented from being charged in the protective film 235 formed on the vibration portion 120, so that it is possible to prevent variations in resonant frequency due to the electric charges charged in the vibration portion 120.

It is noted that connection modes materials, effects, and the like of the vias V1, V2, and V3 are similar to those of the via V4, so that description thereof will be omitted.

Second Exemplary Embodiment

The second exemplary embodiment of the present invention will be described with reference to FIG. 7 and FIG. 8. In the second and subsequent embodiments, description of the same matters as those in the first embodiment will be omitted, and only different points will be described. In particular, similar effects with the similar configuration will not be fully described for each embodiment.

Figure 7:
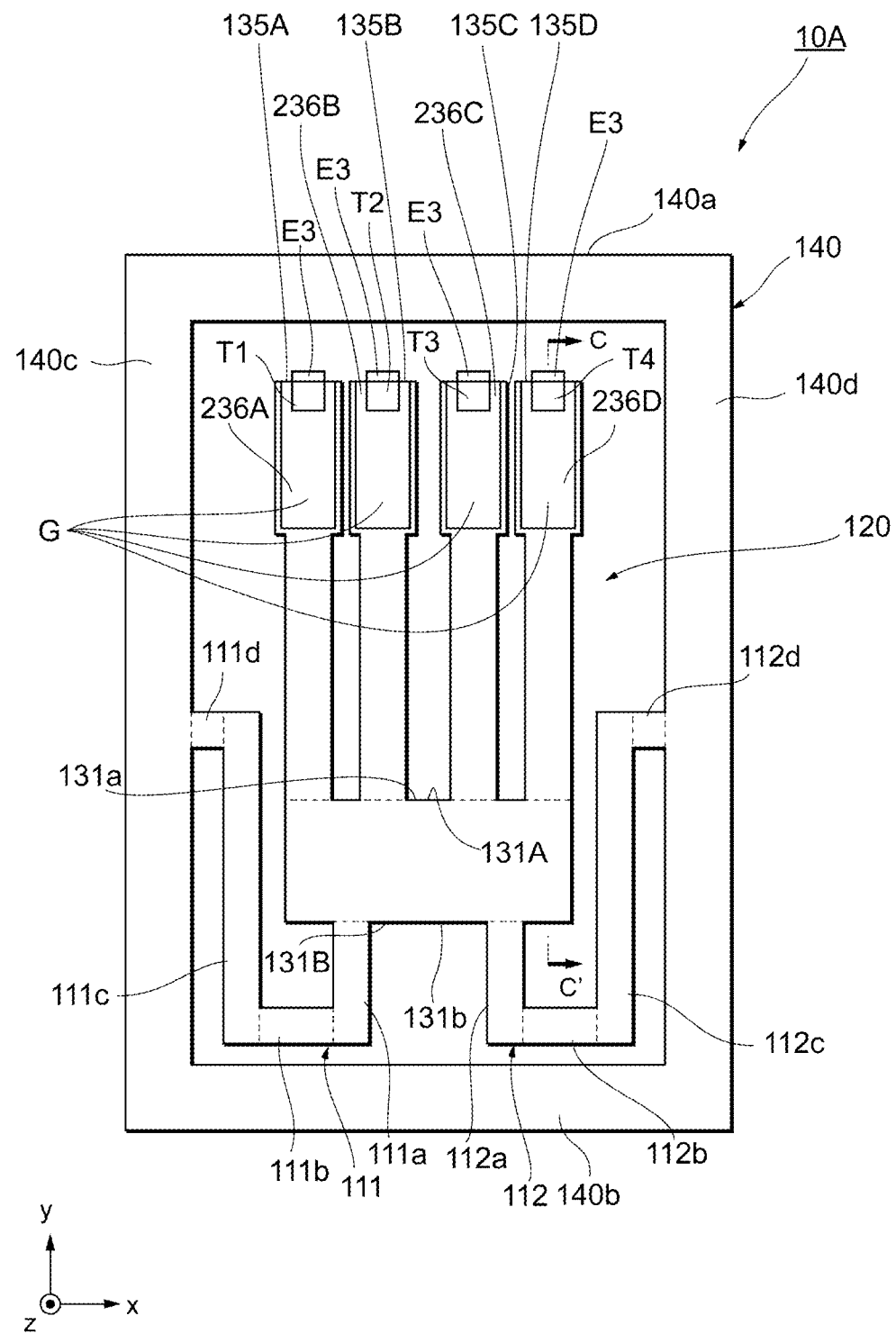
FIG. 7 is a plan view of a resonator according to a second exemplary embodiment.

FIG. 7 is a plan view schematically showing an example of a structure of a resonator 10A according to the present embodiment. Hereinafter, description of a difference between the detailed configurations of the resonator 10A according to the present embodiment and the resonator 10 according to the first embodiment will be mainly given. The resonator 10A according to the present embodiment includes terminals T1 to T4 instead of the vias V1, V2, V3, and V4 described in the first embodiment.

The terminals T1 to T4 are formed in vicinities of the open ends of the vibration arms 135A to 135D.

Specifically, the terminals T1 to T4 are formed so as to cover at least parts of the end portions at open end sides of the vibration arms 135A to 135D on the frequency adjustment films 236A to 236D, respectively. The terminals T1 to T4 are formed by using a conductive material such as Al, for example.

Figure 8:
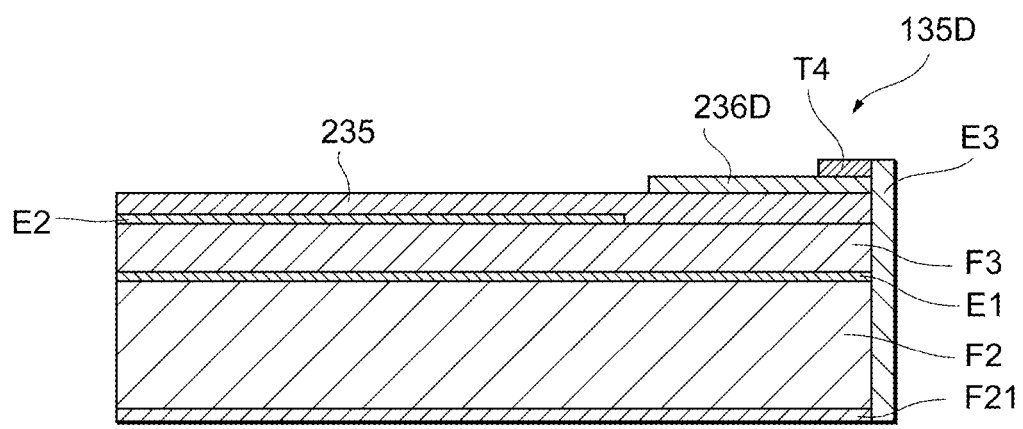
FIG. 8 is a cross-sectional view taken along a line CC' in FIG. 7.

FIG. 8 is a schematic diagram schematically showing a cross section taken along the line CC' in FIG. 7, and shows a case where the frequency adjustment film 236D is connected to the metal layer E1. As shown in FIG. 8, at least a part of an end surface at the open end side of the vibration arm 135D is covered with a metal film E3. The frequency adjustment films 236A to 236D according to the present embodiment are connected to the metal layer E1 with the terminals T1 to T4 and the metal film E3 interposed therebetween, respectively.

The other configurations and functions of the resonance device 1 are similar to those of the first embodiment and will not be repeated herein.

Third Exemplary Embodiment

Figure 9:
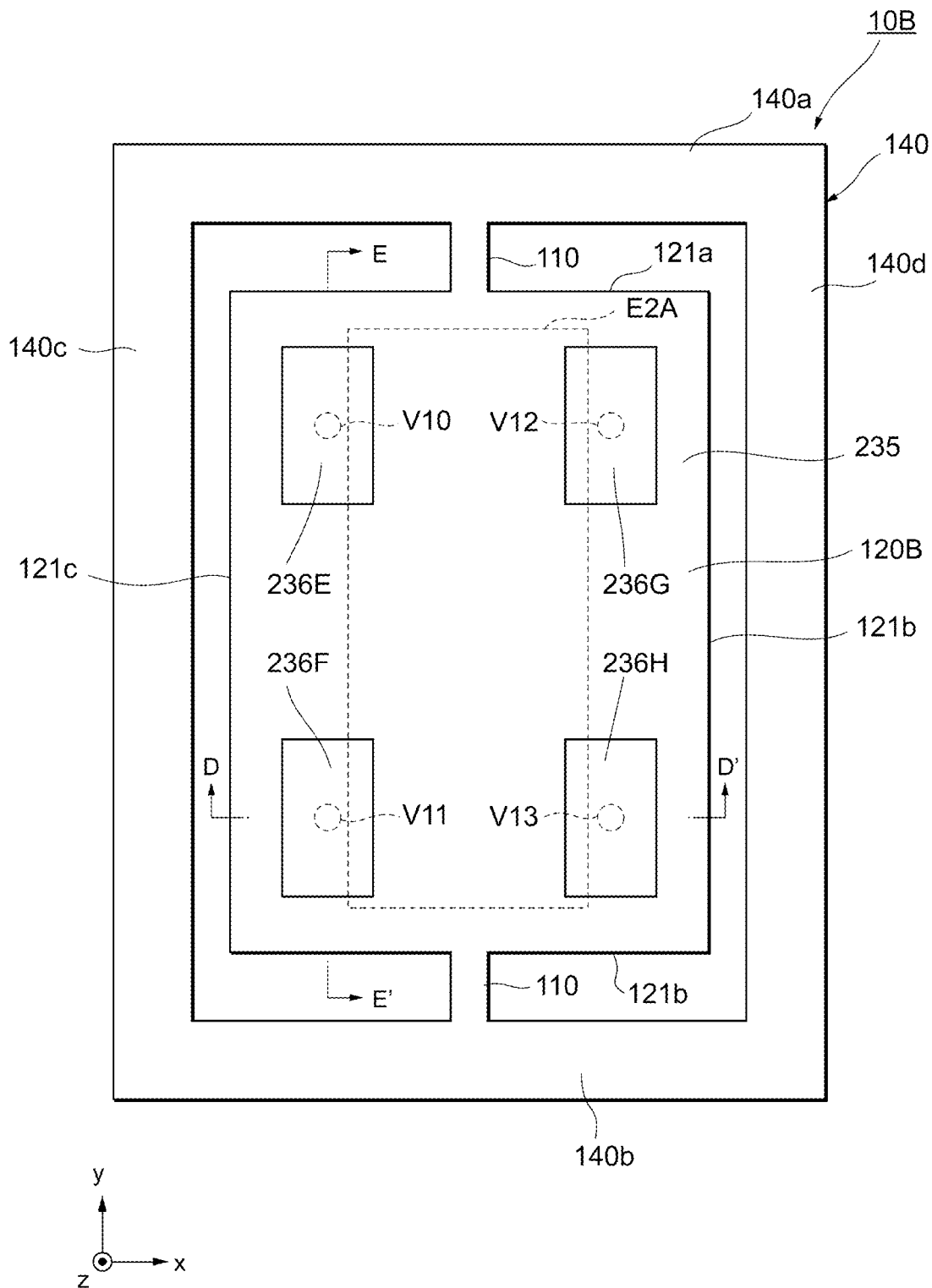
FIG. 9 is a plan view of a resonator according to a third exemplary embodiment.
Figure 10:
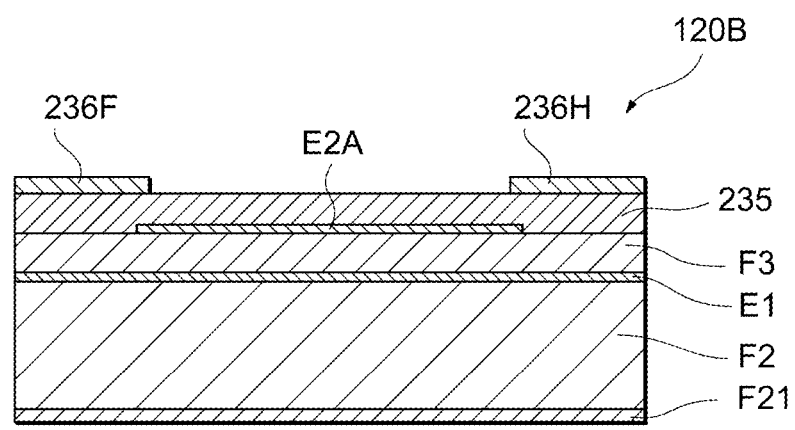
FIG. 10 is a cross-sectional view taken along a line DD' in FIG. 9.
Figure 11:
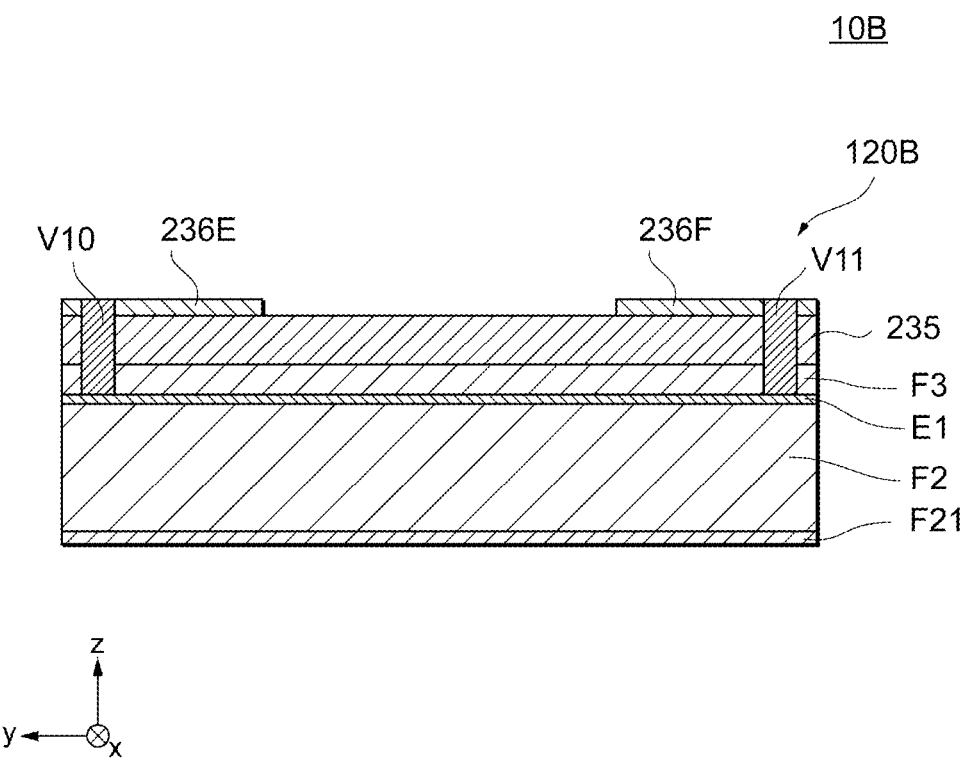
FIG. 11 is a cross-sectional view taken along a line EE' in FIG. 9.

The third embodiment of the present invention will be described with reference to FIG. 9 to FIG. 11. FIG. 9 is a plan view of a resonator 10B according to the present embodiment. In addition, FIGS. 10 and 11 are schematic diagrams schematically showing a cross section taken along the line DD' in FIG. 9 and a cross section taken along the line EE' in FIG. 9, respectively.

In the present embodiment, the resonator 10B is an in-plane vibrator that performs contour vibration in the XY plane. In the present embodiment, the resonator 10B includes vias V10 to V13, a vibration portion 120B, holding arms 110, and a metal layer E2A, instead of the vias V1, V2, V3, and V4, the vibration portion 120, the holding arms 111 and 112, and the metal layer E2 which are described in the first embodiment.

Vibration Portion 120B

The vibration portion 120B has a substantially rectangular parallelepiped contour extending in a flat plate shape along an XY plane in an orthogonal coordinate system shown in FIG. 9. Further, the vibration portion 120B includes short sides 121a and 121b in an X-axis direction, and long sides 121c and 121d in a Y-axis direction. The vibration portion 120B is connected to and held by the holding portion 140 by a pair of holding arms 110 on the short sides 121a and 121b. The protective film 235 is formed so as to cover the entire surface of the vibration portion 120B. Further, four frequency adjustment films 236E to 236H are laminated on four corners of the vibration portion 120B (one example of the second region) on the surface of the protective film 235.

The other configurations of the vibration portion 120B is similar to the vibration portion 120 of the first embodiment and will not be repeated herein. However, it is also noted that the number of the frequency adjustment films is not limited to four, and for example, may be two in such a manner that the frequency adjustment films 236E and 236F are connected to each other, and the frequency adjustment films 236G and 236H are connected to each other. However, it is preferable that the frequency adjustment film includes the second region having large displacement during vibration, and that the second region is equal to or smaller than an area of the first region other than the second region on the surface of the vibration portion 120B. Thus, frequency adjustment can be efficiently performed, and a change in frequency temperature characteristics due to the frequency adjustment can be suppressed.

Holding Arm 110

As further shown in FIG. 9, the one pair of holding arms 110 have a substantially rectangular shape having long sides in the Y-axis direction and short sides in the X-axis direction.

Each of the one pair of holding arms 110 is connected to a vicinity of a center of each of the short sides 121a and 121b of the vibration portion 120 at one end thereof, and extends substantially perpendicularly from the connected vicinity of the center of the vibration portion 120 along the Y-axis direction. Additionally, each of the holding arms 110 is connected to a vicinity of a center of each of the frame bodies 140a and 140b in the holding portion 140 at the other end thereof.

The other configurations and functions of the holding arms 110 are similar to those of the holding arms 111 and 112 of the first embodiment and will not be repeated herein.

Vias V10 to V13

In this embodiment, the vias V10 to V13 are formed in regions that do not overlap the metal layer E2A in the frequency adjustment films 236E to 236H, respectively. The other configurations of the vias V10 to V13 are similar to those of the vias V1 to V4 of the first embodiment and will not be repeated herein.

Metal Layers E2A and E1

The metal layer E2A is adjusted and formed such that regions overlapping the frequency adjustment films 236E to 236H are as small as possible. In this embodiment, the metal layer E2A is formed such that areas of the regions overlapping the frequency adjustment films 236E to 236H are equal to or smaller than half of a sum of areas of the frequency adjustment films 236E to 236H.

The other configurations of the metal layer E2A are similar to those of the metal layer E2 in the first embodiment and will not be repeated herein.

By applying an electric field to the piezoelectric thin film F3 by using the metal layer E2A and the metal layer E1, in-plane vibration can be performed. In this embodiment, each of the metal layer E2A and the metal layer E1 is connected to an external AC power source, so that a primary contour vibration can be performed.

It is also possible to obtain a resonator in a high-order mode by consecutively placing a plurality of such rectangular contour vibration resonators as would be appreciated to one skilled in the art.

Connection Mode

As shown in FIG. 11, each of the vias V10 and V11 is formed by filling, with a conductive material, a hole in which parts of the protective film 235 and the piezoelectric thin film F3 are removed such that the surface of the metal layer E1 is exposed. The frequency adjustment films 236E and 236F are connected to the metal layer E1 with vias V10 and V11 interposed therebetween. Connection modes, materials, and the like of the vias V12 and V13 are similar to those of the vias V10 and V11, and therefore description thereof will be omitted.

The other configurations of the vias V10 to V13 are similar to those of the vias V1 to V4 in the first embodiment and will not be repeated herein.

Fourth Exemplary Embodiment

Figure 12:
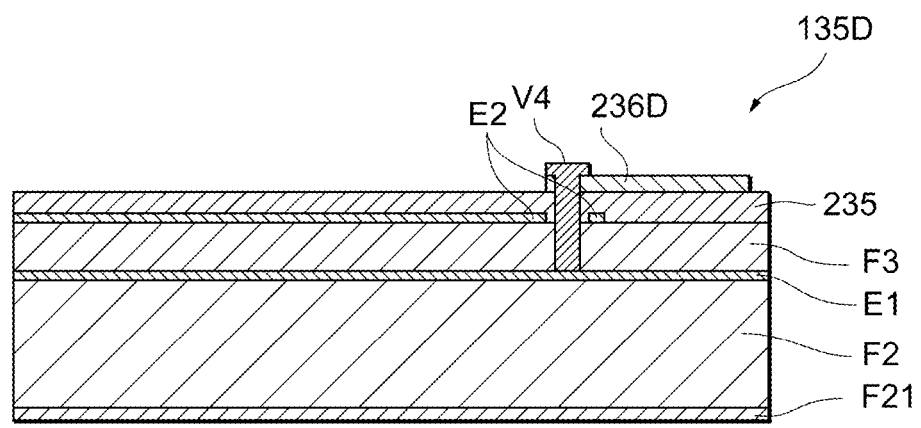
FIG. 12 is a cross-sectional view of a resonator according to a fourth exemplary embodiment, corresponding to FIG. 5.
Figure 13:
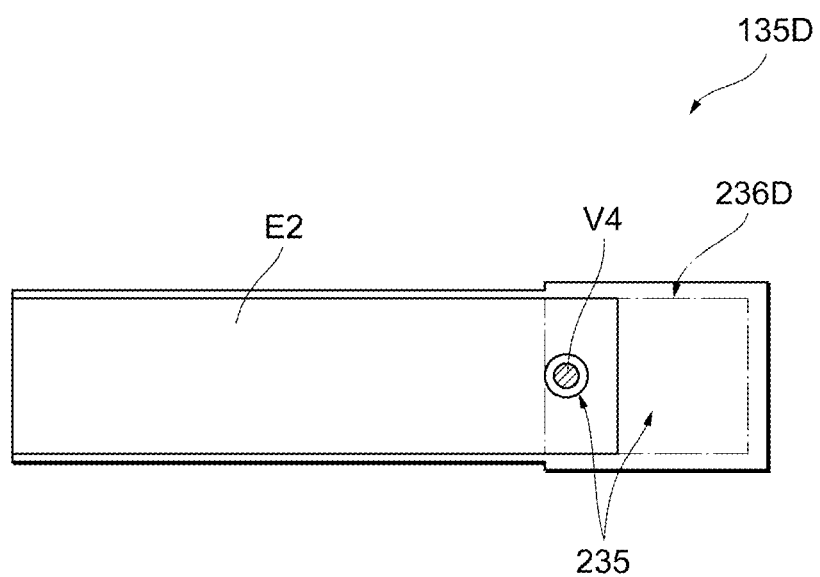
FIG. 13 is a diagram for explaining a structure of a vibration arm of a resonator according to the fourth exemplary embodiment.

The fourth exemplary embodiment of the present invention will be described with reference to FIG. 12 and FIG. 13. FIG. 12 is a cross-sectional view of a resonator 10C according to the present embodiment, corresponding to FIG. 5 in the first embodiment. Also, FIG. 13 is a plan view of the vibration arm 135D according to the present embodiment on a plane along an upper surface of the metal layer E2 (e.g., the frequency adjustment film 236D is not present on the plane but is indicated by a one-dot chain line for the sake of explanation). Furthermore, since a plan view on a surface of the resonator 10C is similar to that in the first embodiment (FIG. 3), description thereof will be omitted.

As shown in FIG. 12, the metal layer E2 in the present embodiment has a region in which a part of the metal layer E2 overlaps the frequency adjustment film 236D. Further, as shown in FIG. 12 and FIG. 13, the protective film 235 is formed along an inner wall of the via V4 such that metal filled in the via V4 is not connected to the metal layer E2. It is noted that configurations of the vias V1 to V3, the vibration arms 135A to 135C, and the frequency adjustment films 236A to 236C are similar to those of the via V4, the vibration arm 135D, and the frequency adjustment film 236D, respectively, so that description will be omitted.

The other configurations of the resonator 10C are similar to those of the first embodiment and will not be repeated herein.

In general, the exemplary embodiments of the present invention have been described above. The resonator 10 according to one exemplary aspect includes the vibration portion 120 including the upper electrode E2 and the lower electrode E1, the piezoelectric film F3 provided between the upper electrode E2 and the lower electrode E1, having the main surface facing the upper electrode E2, and configured to vibrate the vibration portion 120 in a predetermined vibration mode when a voltage is applied between the upper electrode E2 and the lower electrode E1, the protective film 235 provided to face the main surface of the piezoelectric film F3 with the upper electrode E2 interposed between the protective film 235 and the main surface of the piezoelectric film F3, exposed in the first region in the vibration portion 120, and made of a piezoelectric material, the conductive film 236 provided so as to face the main surface of the piezoelectric film F3 with the protective film 235 interposed between the conductive film 236 and the main surface of the piezoelectric film F3 and exposed in the second region that is the region adjacent to the first region in the vibration portion 120, and the connection electrodes V1 to V4 (E3) formed in the protective film 235 to electrically connect the conductive film 236 and the lower electrode E1, the holding portion 140 provided so as to surround at least a part of the vibration portion 120, and holding arms 111 and 112 connecting the vibration portion 120 and the holding portion 140, in which the upper electrode E2 is formed such that the area of the region overlapping the conductive film 236 is equal to or smaller than half of a total area of the conductive film 236 or so as to avoid the region overlapping the conductive film 236. Thus, it is possible to suppress the vibration of the piezoelectric thin film F3 due to the electric field generated in the protective film 235.

Further, the protective film 235 is preferably made of a piezoelectric material that has the same orientation direction as that of the piezoelectric film F3. Moreover, it is preferable that the connection electrode is a via electrode that penetrates at least the protective film 235.

Further, it is preferable that the vibration portion 120 includes the vibration arm 135 that has a fixed end and an open end and that performs bending vibration, and the base portion 130 that has a front end connected to the fixed end of the vibration arm 135 and a rear end facing the front end, and the second region is a region in a vicinity of the open end of the vibration arm 135. Further, the vibration portion 120 may have at least one rectangular vibration region in which the piezoelectric film F3 performs contour vibration according to a voltage applied to the piezoelectric film F3, and has long sides parallel to nodes of the contour vibration of the piezoelectric film F3 and short sides orthogonal to the nodes of the contour vibration of the piezoelectric film F3 and corresponding to a half wavelength of the contour vibration, and the second region may include a corner portion of the vibration region.

Additionally, the resonance device 1 according to the present embodiment includes the resonator 10 described above, the upper lid 30 and the lower lid 20 provided to face each other with the resonator 10 interposed therebetween, and an outer electrode. Since the exemplary resonance device 1 is configured to suppress electric charges from being charged in the protective film 235 formed on the vibration portion 120, vibrations in resonant frequency due to electric charges charged in the vibration portion 120 can be prevented.

The exemplary embodiments described above are intended to facilitate understanding of the present invention, and are not intended to limit the present invention. Thus, the present invention may be modified or improved without departing from the spirit and scope of the present invention. That is, various design modifications of each embodiment to be made by those skilled in the art as appropriate are included within the scope of the present invention as long as the features of the present invention are included. For example, the respective elements, the arrangement thereof, the materials, the conditions, the shapes, the sizes and the like included in each embodiment are not limited to those exemplified, and can be modified as appropriate. For example, in the exemplary embodiments described above, the laminated body configured with the metal layer E2 and the piezoelectric thin film F3 has been described as a configuration having a single layer, but the present invention is not limited thereto. In addition, the resonator 10 may have a configuration in which the laminated body configured with the metal layer E2 and the piezoelectric thin film F3 is of multilayer, and the protective film 235 is formed on a surface of the uppermost layer (at an upper lid 30 side). Moreover, it is generally noted that the exemplary embodiments are merely examples, and partial substitutions or combinations of the configurations shown in different embodiments are possible, and these are also included within the scope of the present invention as long as they include the features of the present invention.

REFERENCE SIGNS LIST

1 RESONANCE DEVICE
10, 10A, 10B RESONATOR
30 UPPER LID
20 LOWER LID
140 HOLDING PORTION
140a TO 140d FRAME BODY
110, 111, 112 HOLDING ARM
120, 120A, 120B VIBRATION PORTION
130 BASE PORTION
135A TO 135D VIBRATION ARM
F2 Si SUBSTRATE
F21 SILICON OXIDE LAYER (TEMPERATURE CHARACTERISTIC CORRECTION LAYER)
V1 TO V4, V10 TO V13 VIA
235 PROTECTIVE FILM
236 FREQUENCY ADJUSTMENT FILM

The invention claimed is:

1. A resonator comprising:
a vibration portion including:
an upper electrode and a lower electrode,
a piezoelectric film disposed between the upper and lower electrodes and having a main surface that faces the upper electrode,
a protective film comprising an insulator and facing the main surface of the piezoelectric film with the upper electrode interposed therebetween, such that the protective film is exposed in a first region in the vibration portion,
a conductive film facing the main surface of the piezoelectric film with the protective film interposed therebetween, such that the conductive film is exposed in a second region in the vibration portion that is adjacent to the first region, and
a connection electrode disposed in the protective film that electrically connects the conductive film to the lower electrode; and
a frame that surrounds at least a part of the vibration portion; and
a holding arm that connects the vibration portion to the holding portion,
wherein the upper electrode comprises an area of a region that overlaps the conductive film that is equal to or smaller than half of a total area of the conductive film.

2. The resonator according to claim 1, wherein the upper electrode does not overlap the conductive film in a direction orthogonal to the main surface of the piezoelectric film.

3. The resonator according to claim 1, wherein the vibration portion is configured to vibrate in a predetermined vibration mode when a voltage is applied between the upper electrode and the lower electrode.

4. The resonator according to claim 1, wherein the protective film comprises a piezoelectric material.

5. The resonator according to claim 4, wherein the piezoelectric material of the protective film comprises a same orientation direction as the piezoelectric film of the vibration portion.

6. The resonator according to claim 1, wherein the connection electrode is a via electrode that extends through at least the protective film.

7. The resonator according to claim 6, wherein the via electrode extends through the piezoelectric film and is electrically connected to the lower electrode of the vibration portion.

8. The resonator according to claim 1, wherein the vibration portion includes a base having a front end and a rear end that opposes the front end, and at least one vibration arm that has a fixed end coupled to the front end of the base and an open end opposite the fixed end and configured to perform bending vibration.

9. The resonator according to claim 7, wherein the second region is disposed at the open end of the at least one vibration arm.

10. The resonator according to claim 8, further comprising a metal film disposed on an outer side of the at least one vibration arm to face a side surface of the frame, with the metal film connecting the connection electrode to the lower electrode.

11. The resonator according to claim 1, wherein the vibration portion comprises a rectangular vibration shape in which the piezoelectric film is configured to perform contour vibration when a voltage applied to the piezoelectric film, with the rectangular vibration shape having long sides parallel to nodes of the contour vibration of the piezoelectric film and short sides orthogonal to the nodes of the contour vibration of the piezoelectric film, such that the short sides correspond to a half wavelength of the contour vibration.

12. The resonator according to claim 11, wherein the second region comprises a plurality of regions disposed at respective corners of the vibration region.

13. A resonator comprising:
an upper electrode;
a lower electrode;
a piezoelectric film disposed between the upper and lower electrodes;
a protective film comprising an insulator and disposed above the upper electrode on a side opposite to the piezoelectric film;
a conductive film disposed above the protective film on a side opposite to the upper electrode; and
a connection electrode disposed in the protective film that electrically connects the conductive film to the lower electrode,
wherein the upper electrode overlaps the conductive film in a direction orthogonal to a main surface of the piezoelectric film in an overlapping region that is equal to or smaller than half of a total surface area of the conductive film.

14. The resonator according to claim 13, wherein the protective film is disposed in a first region above the piezoelectric film, and the conductive film is disposed in a second region above the piezoelectric film that is adjacent to the first region.

15. The resonator according to claim 13, wherein the upper electrode does not overlap the conductive film in the direction orthogonal to the main surface of the piezoelectric film.

16. The resonator according to claim 13, wherein the resonator is configured to vibrate in a predetermined vibration mode when a voltage is applied between the upper electrode and the lower electrode.

17. The resonator according to claim 13, wherein the protective film comprises a piezoelectric material that has a same orientation direction as the piezoelectric film.

18. The resonator according to claim 13, wherein the connection electrode is a via electrode that extends through at least the protective film.

19. The resonator according to claim 18, wherein the via electrode extends through the piezoelectric film and is electrically connected to the lower electrode of the vibration portion.

20. A resonance device comprising:
a resonator that includes:
    a vibration portion having:
        an upper electrode and a lower electrode,
        a piezoelectric film disposed between the upper and lower electrodes and having a main surface that faces the upper electrode,
        a protective film comprising an insulator and facing the main surface of the piezoelectric film with the upper electrode interposed therebetween, such that the protective film is exposed in a first region in the vibration portion,
        a conductive film facing the main surface of the piezoelectric film with the protective film interposed therebetween, such that the conductive film is exposed in a second region in the vibration portion that is adjacent to the first region, and
        a connection electrode disposed in the protective film that electrically connects the conductive film to the lower electrode; and
    a frame that surrounds at least a part of the vibration portion; and
    a holding arm that connects the vibration portion to the holding portion,
    wherein the upper electrode comprises an area of a region that overlaps the conductive film that is equal to or smaller than half of a total area of the conductive film;
an upper lid and a lower lid that face each other with the resonator interposed therebetween; and
an outer electrode.

* * * * *